United States Patent
Chi et al.

(10) Patent No.: US 12,394,628 B2
(45) Date of Patent: Aug. 19, 2025

(54) METHODS FOR POLISHING SEMICONDUCTOR SUBSTRATES

(71) Applicant: GlobalWafers Co., Ltd., Hsinchu (TW)

(72) Inventors: Sherry Chi, Hsinchu (TW); HanChung Huang, Hsinchu (TW); Patrick Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 360 days.

(21) Appl. No.: 17/973,747

(22) Filed: Oct. 26, 2022

(65) Prior Publication Data

US 2023/0197455 A1 Jun. 22, 2023

Related U.S. Application Data

(60) Provisional application No. 63/291,085, filed on Dec. 17, 2021.

(51) Int. Cl.
| | |
|---|---|
| *H01L 21/306* | (2006.01) |
| *B24B 1/00* | (2006.01) |
| *B24B 37/04* | (2012.01) |
| *B24B 37/30* | (2012.01) |
| *C09G 1/00* | (2006.01) |
| *C09G 1/02* | (2006.01) |
| *C09K 3/14* | (2006.01) |
| *H01L 21/02* | (2006.01) |
| *H01L 21/321* | (2006.01) |

(52) U.S. Cl.
CPC .......... *H01L 21/30625* (2013.01); *B24B 1/00* (2013.01); *B24B 37/042* (2013.01); *B24B 37/044* (2013.01); *B24B 37/30* (2013.01); *C09G 1/00* (2013.01); *C09G 1/02* (2013.01); *C09K 3/1436* (2013.01); *C09K 3/1454* (2013.01); *C09K 3/1463* (2013.01); *H01L 21/02024* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 8,277,671 B2 | 10/2012 | Everson et al. | |
| 8,815,110 B2 | 8/2014 | Reiss et al. | |
| 10,128,146 B2 | 11/2018 | Wang et al. | |
| 10,811,307 B2 | 10/2020 | Wang et al. | |
| 11,043,395 B2 | 6/2021 | Grabbe et al. | |
| 2001/0014570 A1 | 8/2001 | Wenski et al. | |
| 2013/0023186 A1 | 1/2013 | Motoshima et al. | |
| 2017/0178890 A1* | 6/2017 | Chu | H01L 22/20 |
| 2018/0323079 A1 | 11/2018 | Grabbe et al. | |
| 2020/0051809 A1 | 2/2020 | Peng et al. | |
| 2020/0083057 A1 | 3/2020 | Yoshimura et al. | |
| 2021/0013092 A1 | 1/2021 | Wang et al. | |

* cited by examiner

*Primary Examiner* — Jiong-Ping Lu
(74) *Attorney, Agent, or Firm* — Armstrong Teasdale LLP

(57) ABSTRACT

Methods for polishing semiconductor substrates are disclosed. The methods may involve alternating a first and second polishing slurry during polishing. The first and second slurries each contain silica particles with the silica particles of the first slurry containing more silica than the particles of the second slurry. By alternating between first and second polishing slurries, the polishing method may improve wafer flatness.

19 Claims, 10 Drawing Sheets

METHODS FOR POLISHING SEMICONDUCTOR SUBSTRATES

CROSS-REFERENCE TO RELATED APPLICATION

This application claims the benefit of U.S. Provisional Patent Application No. 63/291,085, filed Dec. 17, 2021, which is incorporated herein by reference in its entirety.

FIELD OF THE DISCLOSURE

The field of the disclosure relates to methods for polishing semiconductor substrates and, in particular, methods that reduce Site Total Indicated Reading (STIR) for polished semiconductor substrates.

BACKGROUND

Semiconductor wafers are used in the production of semiconductor devices such as integrated circuit (IC) chips, silicon-on-insulator (SOI) wafers, and radio frequency-SOI (RF-SOI) wafers. Typically, the rough surface of the semiconductor wafer needs to be further processed to have characteristics that meet the strict parameters for production of semiconductor devices, such as IC chips, SOI wafers, and RF-SOI wafers.

Typically, surfaces of semiconductor wafers are polished to improve surface characteristics including polycrystalline layer roughness and micro-defects. One way to polish a semiconductor wafer is referred to as chemical-mechanical polishing (CMP). CMP processes often use a circular polishing pad. The pad is rotated and the wafer is brought into contact with and forced against the pad as a slurry is applied to the pad. However, the wafer can unevenly contact the pad, particularly toward the wafer edge. Such uneven contact impacts surface characteristics after polishing, which might cause the wafer to be unsatisfactory or require additional processing. For example, the wafer may taper at a high rate due to uneven contact between the pad and the wafer. Site Total Indicated Reading (STIR) is a site-by-site measurement of the flatness of the wafer. Single side polishing methods often result in poor STIR toward the wafer edge.

There is a need for methods for manufacturing semiconductor structures that improve wafer flatness.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for polishing a semiconductor substrate having a front surface and a back surface generally parallel to the front surface. The front surface of the substrate is contacted with a polishing pad in the presence of a first polishing slurry in a first polishing step. The front surface of the substrate is contacted with a polishing pad in the presence of a second polishing slurry in a second polishing step. The second polishing step commences after the first polishing step. The front surface of the substrate is contacted with a polishing pad in the presence of the first polishing slurry in a third polishing step. The third polishing step commences after the second polishing step.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for polishing semiconductor substrates. Examples of substrates that may be polished according to the methods described herein include silicon substrates such as single crystal silicon semiconductor substrates. In some embodiments, the substrate is a layered substrate such as a substrate having a layer of single crystal silicon therein. Single crystal silicon semiconductor substrates may be used to prepare electronic devices such as integrated circuit (IC) chips, silicon-on-insulator (SOI) wafers, and radio frequency-SOI (RF-SOI) wafers. In embodiments in which the substrates are used to produce SOI wafers, the SOI wafers may be fabricated be the process described in U.S. Pat. No. 10,128,146. The substrate may be any diameter suitable for use by those of skill in the art including, for example, 200 mm, 300 mm, greater than 300 mm or even 450 mm diameter wafers. In some embodiments, the substrate that is polished is 200 mm in diameter.

Figure 1:
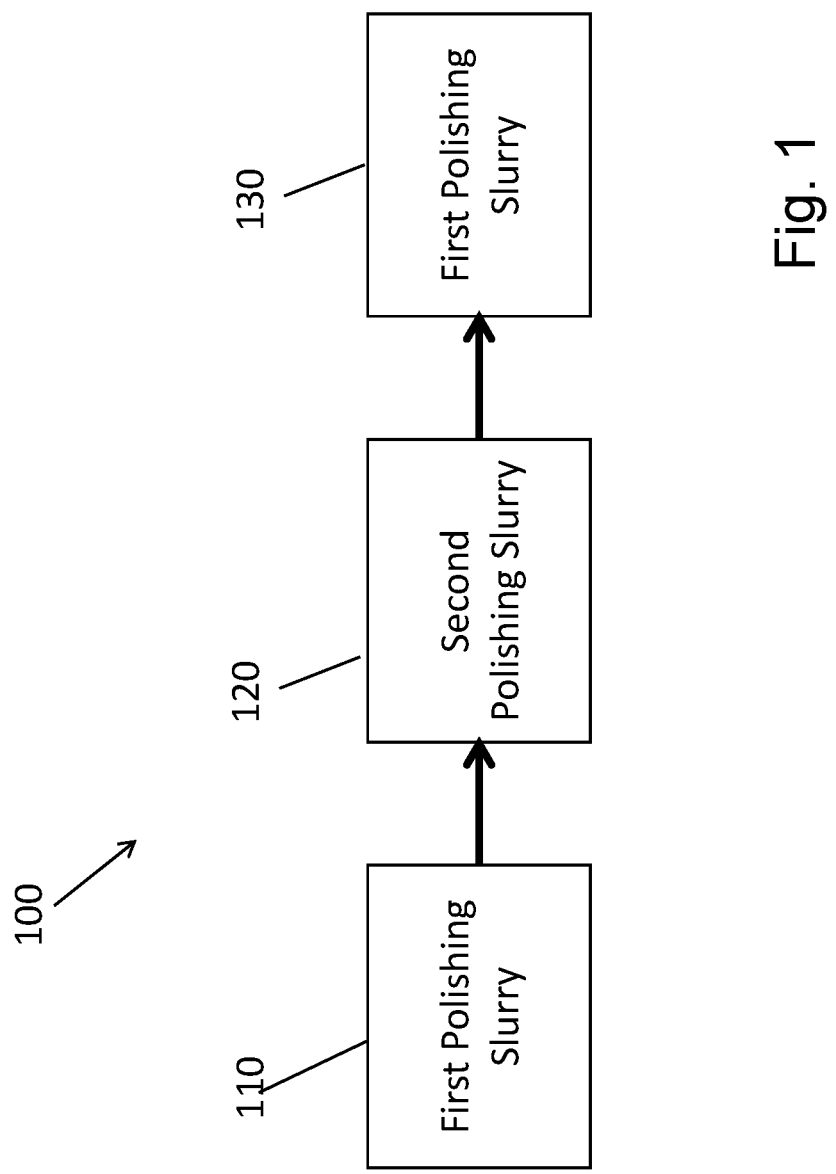
FIG. 1 is a block diagram of an embodiment of a method for polishing a semiconductor structure.

Referring now to FIG. 1 of the application, an embodiment of a polishing method 100 of the present disclosure is shown. The method 100 involves polishing the front surface of the substrate to achieve a desired surface roughness. The polishing step may be a single-side polish (i.e., the back surface is not polished) which is typical for processing of 200 mm substrates. The single-side polish may reduce the surface roughness of the wafer to less than about 2.0 Å as measured by atomic force microscopy (AFM) at scan sizes of about 10 μm×about 10 μm to about 100 μm×about 100 μm. The single-side polish may even reduce the surface roughness to less than about 1.5 Å or less than about 1.2 Å at scan sizes of about 10 μm×about 10 μm to about 100 μm×about 100 μm. The single-side polish may result in removal of at least about 1 μm of material from the front surface of the substrate which is typical of 200 mm substrate processing in which a single polishing step is performed.

The single-side polish may be achieved by, for example, chemical-mechanical planarization (CMP). CMP typically involves the immersion of the wafer in an abrasive slurry and polishing of the wafer by a polymeric pad. Through a combination of chemical and mechanical means the surface of the wafer is smoothed. Typically the polish is performed until a chemical and thermal steady state is achieved and until the wafers have achieved their targeted shape and flatness.

Suitable polishers for the single-side polish may be obtained from Lapmaster SFT (e.g., LGP-708, Chiyoda-Ku, Japan). In accordance with embodiments of the present disclosure, the pad used for single-side polishing is a suede-type pad (also referred to as a polyurethane foam pad) such as a SURFIN pad from Fujimi (Kiyoso, Japan), a CIEGAL pad from Chiyoda KK (Osaka, Japan) or a SPM pad from Rohm and Haas. Polyurethane impregnated polyethylene pads such as SUBA pads available from Rohm and Haas may also be used.

The single-side polish 100 may occur for at least 60 seconds or even at least 120 seconds, at least 180 seconds, or at least 240 seconds or more. The slurry flow rate may range from about 100 ml/min to about 1,000 ml/min and the pad pressure may range from about 75 g/cm$^2$ to about 125 g/cm$^2$; however, it should be understood that other polish times, pad pressures and slurry flow rates may be used without departing from the scope of the present disclosure.

Referring to FIG. 1, the polishing method involves a first polishing step 110 in which the front surface of the substrate is contacted with a polishing pad in the presence of a first polishing slurry. In a second step 120, the front surface of the substrate is contacted with a polishing pad in the presence of a second polishing slurry (i.e., the second step is subsequent to the first step in that the second polishing step commences after the flow of the first polishing slurry has been stopped or is commensurate therewith). In a third polishing step 130, the front surface of the substrate is contacted with a polishing pad in the presence of the first polishing slurry (i.e., the third polishing step commences after the second polishing step is performed).

In some embodiments, each of the first and second polishing slurries is a polydisperse slurry that includes colloidal silicon particles. The first slurry includes silica particles having a silica content of $X_1$ wt % and the second slurry comprises silica particles having a silica content of $X_2$ wt %. $X_1$ is greater than $X_2$. The silica particles of the first and second slurries may be amorphous silica and are generally spherical. The silica content of the particles may be varied (i.e., between the first and second slurries) by individually encapsulating the particles of each slurry with a polymer with the degree of encapsulation (i.e., thickness of polymer) being different between the two slurries. The polymer reduces the silica content within the set of particles. In some embodiments, the ratio of $X_1$ to $X_2$ is at least about 2:1 or even at least about 3:1, at least about 5:1, at least about 10:1 or even at least about 15:1. The difference between $X_1$ and $X_2$ (i.e., $X_1$ minus $X_2$) may be about 5 wt %, at least about 10 wt %, at least about 25 wt % or at least about 50 wt %.

In some embodiments, the silica particles of the first slurry are individually polymer encapsulated. The polymer-encapsulated silica particles may comprise at least about 50 wt % silica or at least about 60 wt %, at least about 70 wt %, from about 50 wt % to about 95 wt %, from about 60 wt % to about 95 wt % or from about 70 wt % to about 90 wt % silica.

In some embodiments, the silica particles of the second polishing slurry are also individually encapsulated in a polymer. The silica particles of the second polishing slurry include less than about 25 wt % silica or, as in other embodiments, less than about 15 wt %, less than about 10 wt %, from about 1 wt % to about 25 wt %, from about 1 wt % to about 15 wt % or from about 1 wt % to about 10 wt % silica.

The polymers used for encapsulation for the silica particles of the first and/or second polishing slurries may be any of the polymers conventionally used in the field of substrate polishing and, in particular, silicon wafer polishing. The polymer may be a water-soluble polymer such as cellulose, substituted-cellulose, modified starches or xanthan gum.

The silica particles of each of the first and second polishing slurries have an average particle size. The average diameters of the particles of both slurries may be less than about 100 nm, less than about 50 nm, from about 10 nm to about 50 nm, from about 20 nm to about 40 nm or from about 30 nm to about 40 nm. In some embodiments, the average diameter of the particles of the first polishing slurry is about 30 nm and/or the average diameter of the particles of the second polishing slurry is about 35 nm.

Each polishing slurry is generally a polydisperse colloid in which the solid-phase silica particles are dispersed in a liquid phase. Suitable liquid phases include aqueous solutions. The slurry may include additional components typical of polishing slurries used to polish single crystal silicon wafers.

In each of the three polishing steps 110, 120, 130, the respective first or second slurry is used without the other slurry being delivered to the polishing pad (i.e., only the first or second slurry is used). Each slurry may be delivered to the pad with other fluids such as deionized water, caustic (e.g., KOH), and/or resins such as nonionic polyethylene oxide polymer (e.g., POLYOX available from DuPont (Wilmington, DE)).

After the single-side polish is complete, the wafers may be rinsed and dried. In addition, the wafers may be subjected to a wet bench or spin cleaning. Wet bench cleaning may include contacting the wafers with SC-1 cleaning solution (i.e., ammonium hydroxide and hydrogen peroxide), optionally, at elevated temperatures (e.g., about 50° C. to about 80° C.). Spin cleaning includes contact with a HF solution and ozonated water and may be performed at room temperature.

Figure 2:
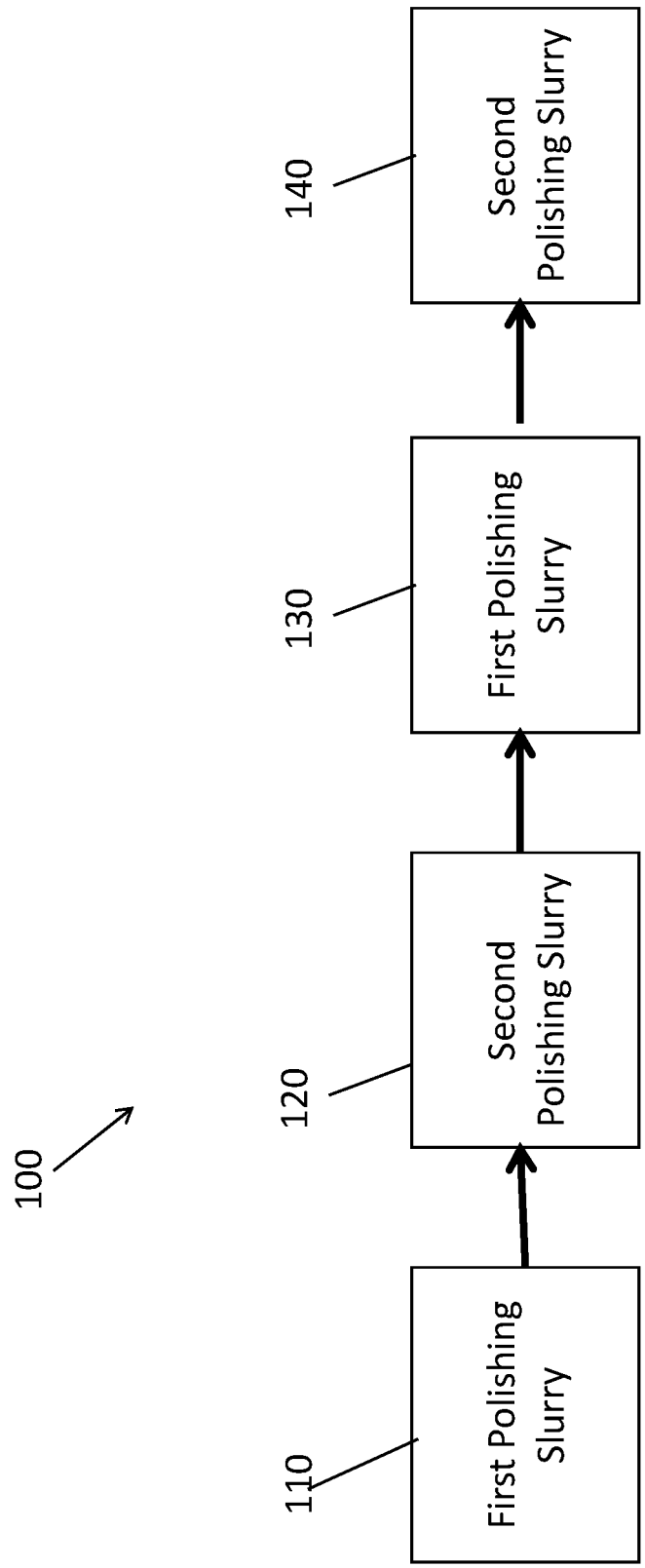
FIG. 2 is a block diagram of another embodiment of a method for polishing a semiconductor structure.

In some embodiments, additional polishing steps are performed as part of the single-side polish. For example and as shown in FIG. 2, the front surface of the substrate is contacted with a polishing pad in the presence of the second polishing slurry in a fourth polishing step 140 that commences after the third polishing step 130.

Figure 3:
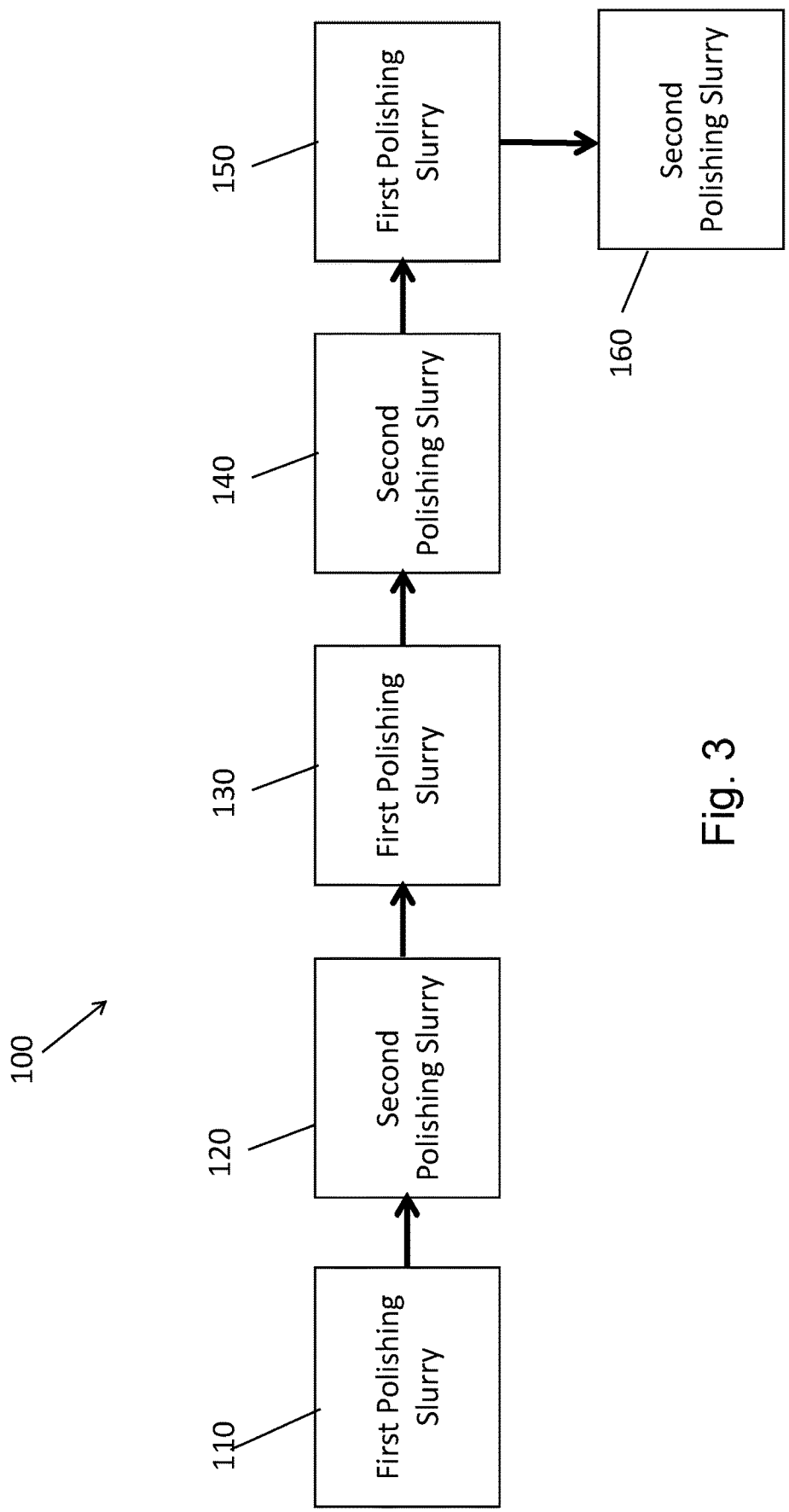
FIG. 3 is a block diagram of another embodiment of a method for polishing a semiconductor structure.

Another embodiment of the polishing method 100 is shown in FIG. 3. In addition to the first 110, second 120, third 130, and fourth 140 polishing steps, the front surface of the substrate is contacted with a polishing pad in the presence of the first polishing slurry in a fifth polishing step 150 that commences after the fourth polishing step 140. The front surface of the substrate is then contacted with a polishing pad in the presence of the second polishing slurry in a sixth polishing step 160 that commences after the fifth polishing step 150.

The polishing steps described above may generally include an amount of overlap (e.g., the second polishing slurry begins to be applied while the first slurry is being turned off). However, generally each step involves a period of time in which only the respective slurry is introduced to the polishing pad (e.g., first slurry but not second slurry in the first polishing step).

The polishing steps described above are generally performed with the same polishing pad being used to contact the front surface of the silicon substrate. The polishing steps are carried out on the same polishing apparatus.

In some embodiments, in addition the polishing method 100 of embodiments of the present disclosure referenced above, the semiconductor structure may be processed in additional steps and/or on additional polishing apparatus. For example, the substrate may be polished in a polishing system 200 (FIG. 4) having a first polishing apparatus 202A, a second polishing apparatus 202B, and third polishing apparatus 202C. While each apparatus 202A, 202B, 202C is shown in an integrated system 200, any one of the apparatus 202A, 202B, 202C may be a stand-alone unit. While three apparatus 202A, 202B, 202C are shown and described, the polishing system 200 may include more or less apparatus.

Figure 5:
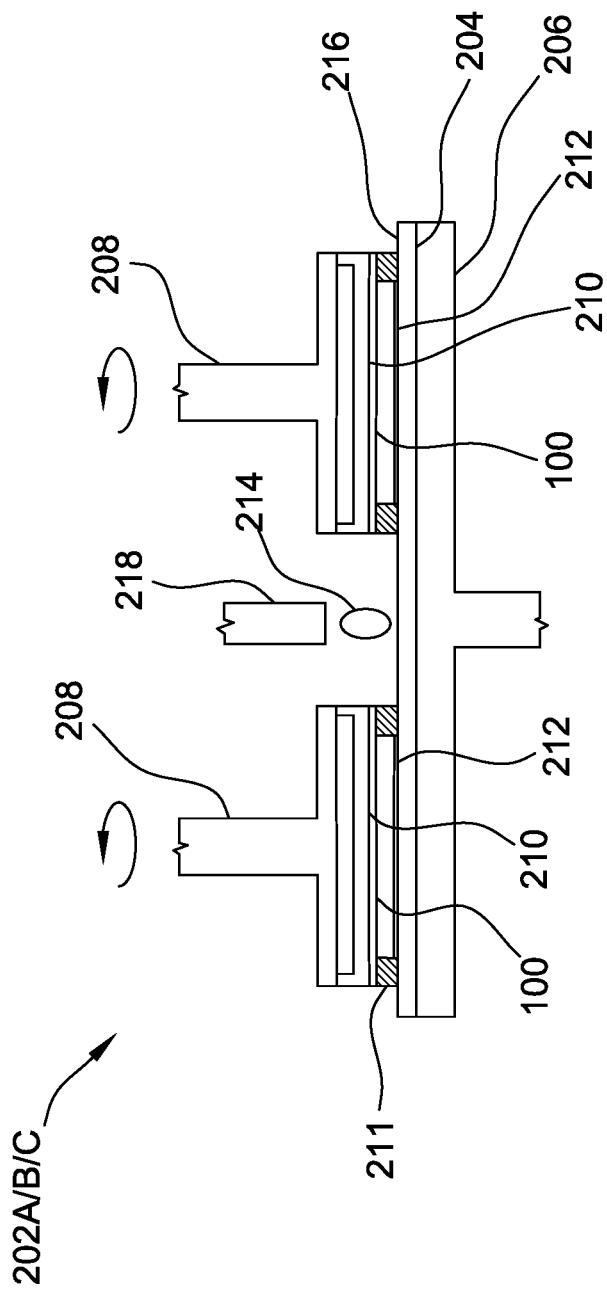
FIG. 5 is a flow diagram showing an embodiment of a method of processing a semiconductor wafer.

As shown in FIG. 5, each substrate polishing apparatus 202A, 202B, 202C includes a polishing pad 204 mounted on a pivotable table 206 and a substrate mounting device 208 having a rotatable head 210 for mounting a semiconductor substrate 100 on the polishing pad 204. Rings 211 facilitate positioning the substrate 100 in relation to the polishing pad 204. In suitable embodiments, the substrate polishing apparatus 202 may include any number of polishing pads 204, substrate mounting devices 208, and rings 211. In the illustrated embodiment, each substrate polishing apparatus 202 includes two substrate mounting devices 208. The substrate mounting device 208 holds the substrate 100 and brings the substrate 100 into contact with the polishing pad 204 as both the substrate 100 and the polishing pad 204 are rotated. The polishing pad 204 polishes a front surface 212 of the wafer 100 through abrasion and with a polishing slurry 214 which is applied to a surface 216 of the polishing pad 204.

In the illustrated embodiment, each substrate polishing apparatus 202 includes a nozzle 218 for dispensing the polishing slurry 214. Each apparatus 202 may include multiple nozzles for dispensing multiple slurries or liquids to the polishing pad 204. Additionally or in addition, different slurries 214 may be dispensed from any single nozzle 218 during the polishing process.

During polishing, polishing slurry 214 is present while contacting the front surface of the substrate with the polishing pad to help polish the front surface 212 of the substrate 100. When the polishing pad 204 is pressed against the substrate 100, the polishing pad 204 works slurry 214 against the front surface 212 of the substrate 100 to concurrently and uniformly remove material from the front surface 212 of the substrate 100 and help improve the overall smoothness of the substrate 100. As the front surface 212 of the substrate 100 is polished, silicon is removed and some minor damage is created on the surface 212 by the abrasive action of the slurry 214.

Figure 4:
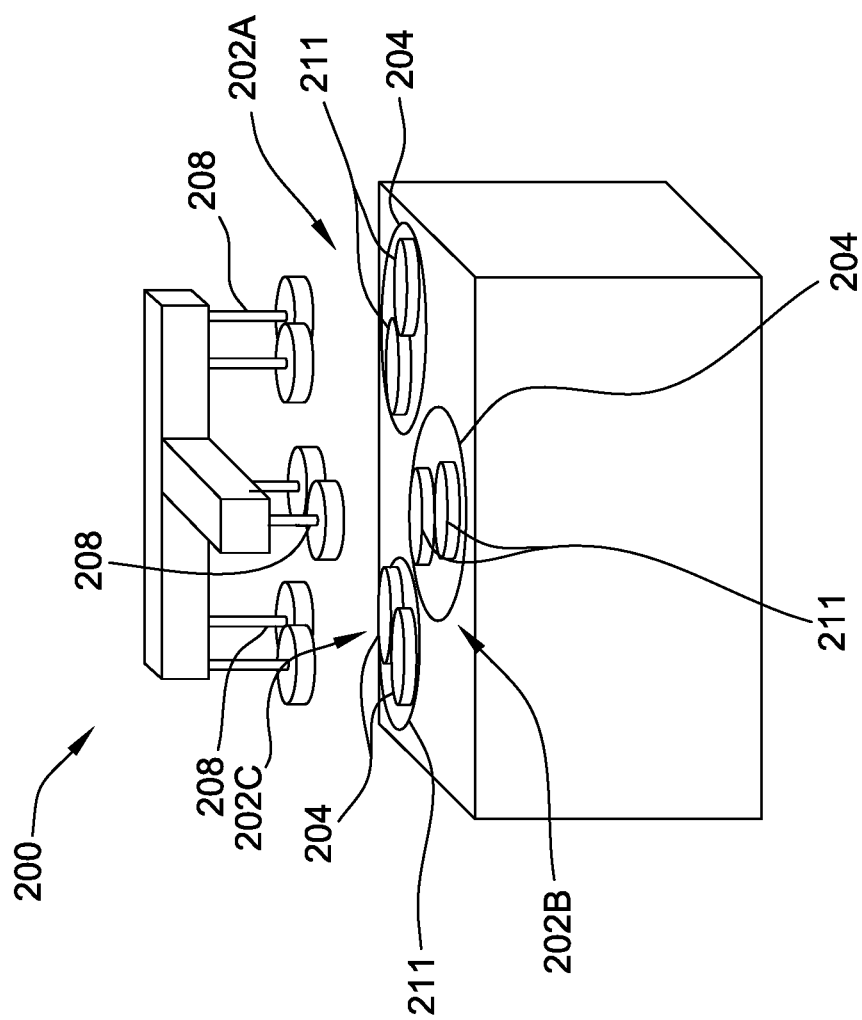
FIG. 4 is a schematic of an embodiment of a wafer polishing system.
Figure 6:
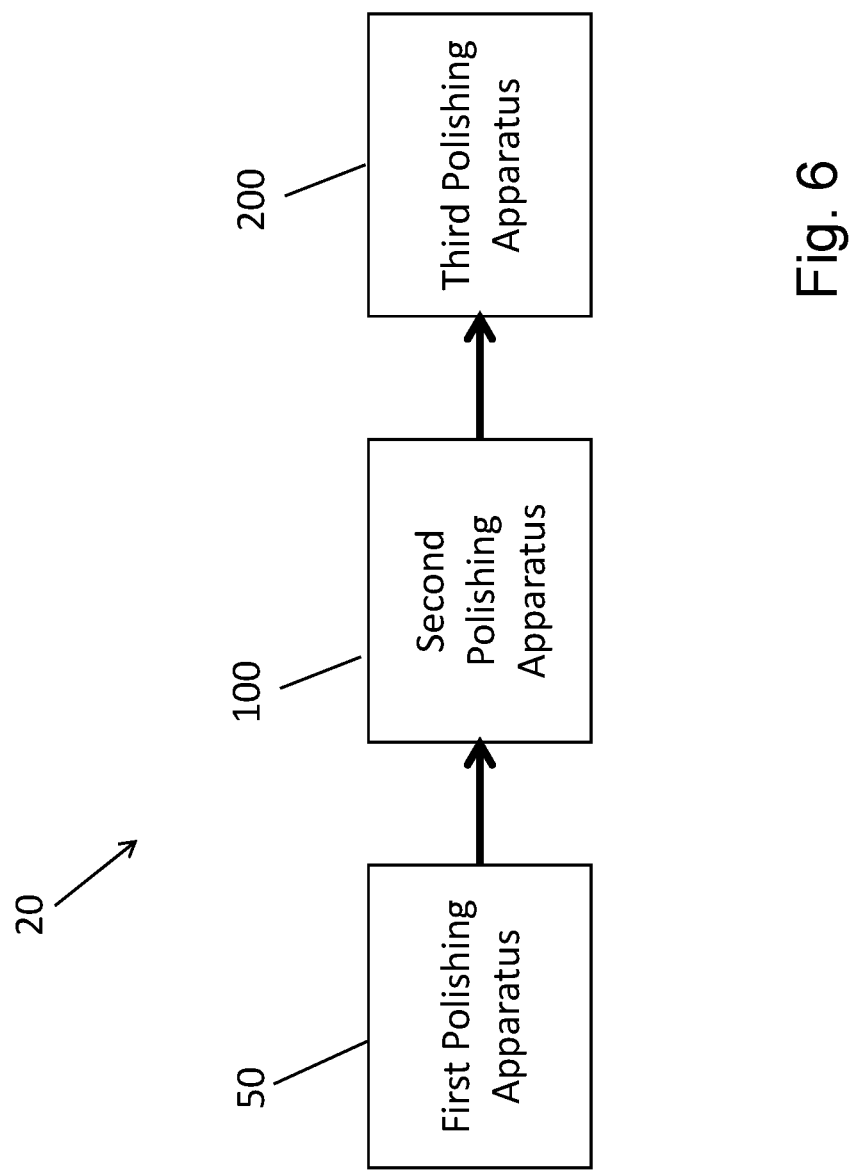
FIG. 6 is a block diagram of an embodiment of a method for polishing a semiconductor structure on a plurality of substrate polishing apparatus.

FIG. 6 is a flow chart of an example method 20 for polishing semiconductor substrates by use of the system 200 shown in FIG. 4 or a similar system. The method 20 generally includes positioning a substrate 100 (FIG. 5) on a first wafer polishing apparatus 202A (FIG. 4) for an initial "rough" polish 50. The substrate 100 may be polished on the first wafer polishing apparatus 202A for any amount of time suitable for a portion of substrate 100 to be abraded and/or a desired smoothness to be achieved. In some embodiments, the substrate 100 is polished on the first wafer polishing apparatus 202A such that thickness is decreased by an amount in the range between about 1 µm and 10 µm, or from 6 µm and 7 µm. As a result, the warp and/or bow of substrate 100 is reduced.

In the example embodiment, the substrate 100 is transferred from the first polishing apparatus 202A to the second polishing apparatus 202B for additional polishing such as the single side polishing method 100 described above (e.g., method 100 of FIG. 1, FIG. 2, or FIG. 3). As described above, in some embodiments of the polishing method 100, the substrate 100 is polished on the second wafer polishing apparatus 202B such that thickness is reduced by an amount in the range between about 1 µm and 10 µm, or from 3 µm to about 4 µm. The substrate 100 may be polished on the second polishing apparatus 202B for any amount of time suitable for a portion of the substrate 100 to be abraded and/or a desired smoothness achieved.

In the polishing method 20, after polishing is complete on the second apparatus 202B, the substrate 100 is transferred to the third polishing apparatus 202C. On the third polishing apparatus 202C, a polishing slurry is applied to the polishing pad 204 during a final "touch" or "flash" polish of the substrate 100 to improve sub-micrometer roughness and substantially eliminate minor defects remaining on the surface 212 of the substrate 100. The final polish also maintains the substrate flatness while imparting a smooth, specular finish to the surface 212 of the substrate 100 that is typical for polished wafers and desired by many device manufactures. This type of final polish generally removes less than about 1 µm of material or between about 0.25 µm and about 0.5 µm of material from surface 212 of the substrate 100.

Compared to conventional methods for polishing substrates, the methods of the present disclosure have several advantages. By alternating between first and second polishing slurries, the polishing method may improve wafer flatness such as the STIR measurement. Improvement in flatness reduces re-work and scrap in wafers. In some embodiments, the first and second slurries each contain silica particles with the silica particles of the first slurry containing more silica than the particles of the second slurry. This allows the first slurry to be a "rough slurry" which removes relatively more material with the second slurry being tailored for edge roll-off control. Alternating the slurries improves flatness without degrading edge roll-off.

EXAMPLES

The processes of the present disclosure are further illustrated by the following Examples. These Examples should not be viewed in a limiting sense.

Example 1: Effect of Polishing Slurry Sequence

Figure 7:
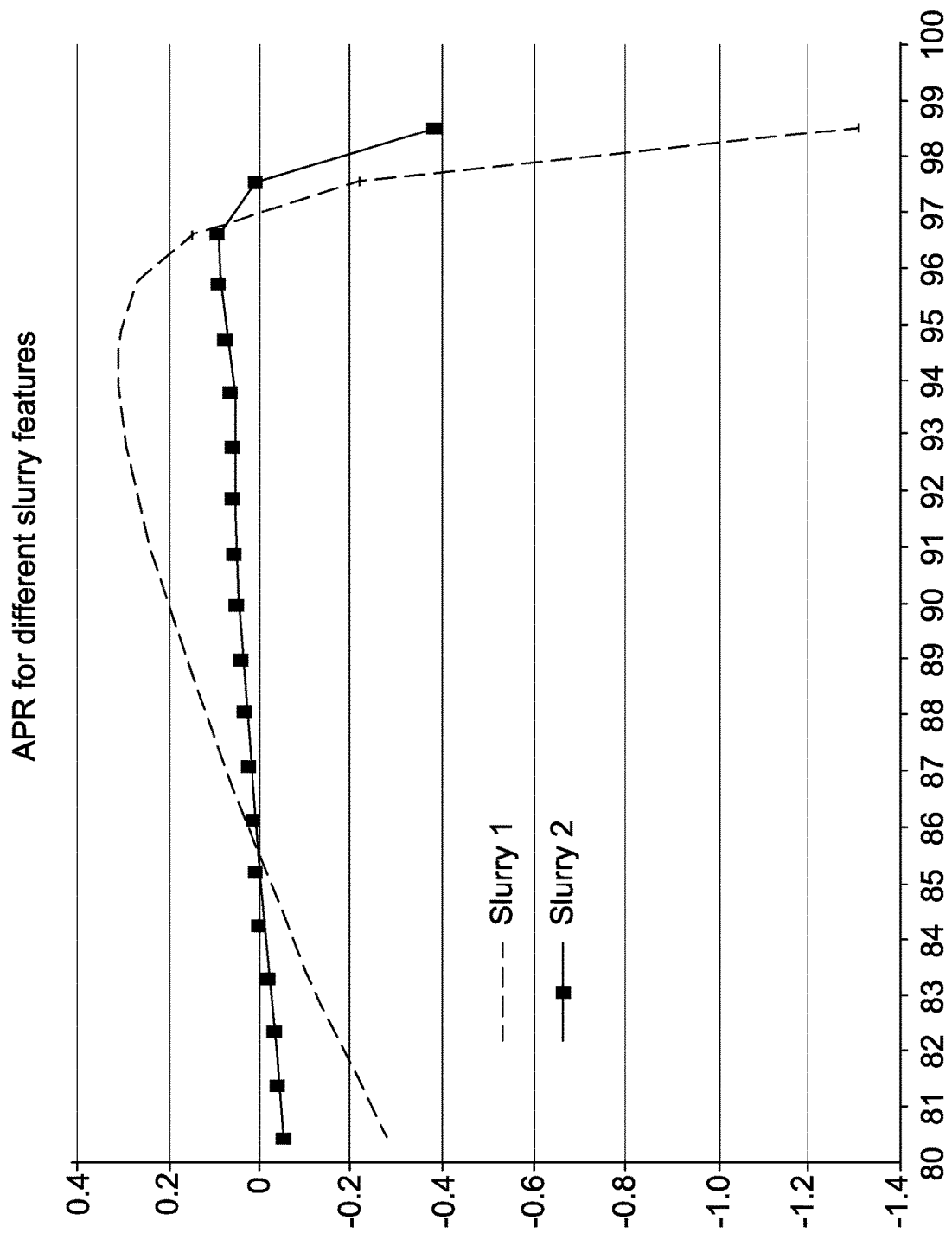
FIG. 7 is a graph showing wafer edge removal profiles when using a single slurry.

FIG. 7 shows the wafer edge removal profiles (normalized thickness) for two sets of single crystal silicon wafers (200 mm) that were single-side polished with different polishing slurries containing polymer-encapsulated colloidal silica. Slurry 1 contained colloidal silica (Nalco DVSTS029) diluted with deionized water. The polishing slurry also included KOH and POLYOX. The polymer-encapsulated silica particles included about 80 wt % silica (with the remainder being polymer) and had an average particle diameter of about 30 nm.

A second set of silicon wafers (200 mm) was also single side polished with a colloidal silica slurry having an average particle size of about 35 nm (Glanzox-3950) diluted with deionized water ("Slurry 2"). The polishing slurry also included KOH and POLYOX. The polymer-encapsulated silica particles included about 5 wt % silica (with the remainder being polymer).

As shown in FIG. 7, Slurry 1 was more abrasive and removed more material. The second slurry resulted in improved edge roll-off.

A third set of silicon wafers (200 mm) was single side polished with a colloidal silica slurry according to the following recipe ("POR"):

TABLE 1

Polishing Recipe with Slurry 1 followed by Slurry 2

| Step | 1 | 2 | 3 | 4 | 5 | 6 | 7 | 8 | 9 |
|---|---|---|---|---|---|---|---|---|---|
| Time | 2 | 10 | 42 | 40 | 46 | 23 | 20 | 4 | 13 |
| Press | 0 | 46 | 46 | 46 | 46 | 15 | 15 | 0 | 0 |
| DI wat | 200 | 200 | 200 | 200 | 200 | 600 | 600 | 600 | 600 |
| PolyOx | 0 | 0 | 0 | 0 | 0 | 0 | 0 | 0 | 600 |
| -Slurry 1- | -35- | -35- | -15- | 0 | 0 | 0 | 0 | 0 | 0 |
| KOH | 0 | 125 | 215 | 100 | 0 | 0 | 0 | 0 | 0 |
| -Slurry 2- | 0 | 0 | -10- | -10- | -10- | -10- | -10- | 0 | 0 |

A fourth set of silicon wafers (200 mm) was single side polished with a colloidal silica slurry according to the following recipe ("New"):

TABLE 2

Polishing Recipe with Slurry 1 and Slurry 2 being Alternated

| Step | 1 | 2 | 3 | 4 | 5 | 6 | 7 | 8 | 9 | 10 | 11 |
|---|---|---|---|---|---|---|---|---|---|---|---|
| Time | 2 | 10 | 25 | 10 | 25 | 10 | 25 | 33 | 43 | 4 | 13 |
| Press | 0 | 46 | 46 | 46 | 46 | 46 | 30 | 30 | 15 | 0 | 0 |
| DI wat | 200 | 240 | 100 | 240 | 100 | 240 | 100 | 300 | 600 | 600 | 600 |
| PolyOx | 0 | 0 | 0 | 0 | 0 | 0 | 0 | 0 | 0 | 0 | 600 |
| -Slurry 1- | -35- | -15- | 0 | -15- | 0 | -15- | 0 | 0 | 0 | 0 | 0 |
| KOH | 0 | 75 | 215 | 75 | 25 | 75 | 215 | 0 | 0 | 0 | 0 |
| -Slurry 2- | 0 | 0 | -10- | 0 | -10- | 0 | -10- | -10- | -10- | 0 | 0 |

Figure 8:
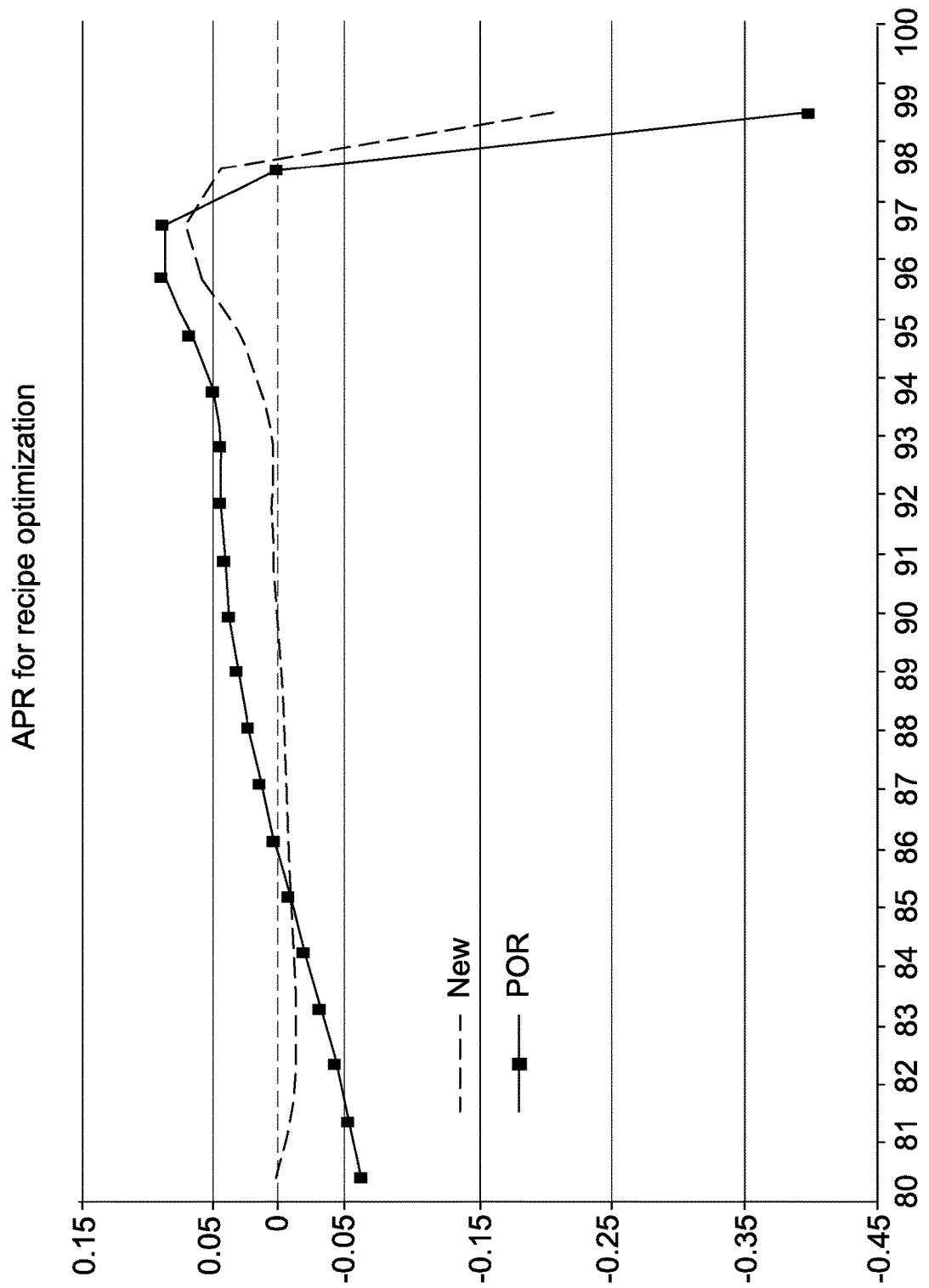
FIG. 8 is a graph showing wafer edge removal by an embodiment of the method of the present disclosure and a conventional method.
Figure 9:
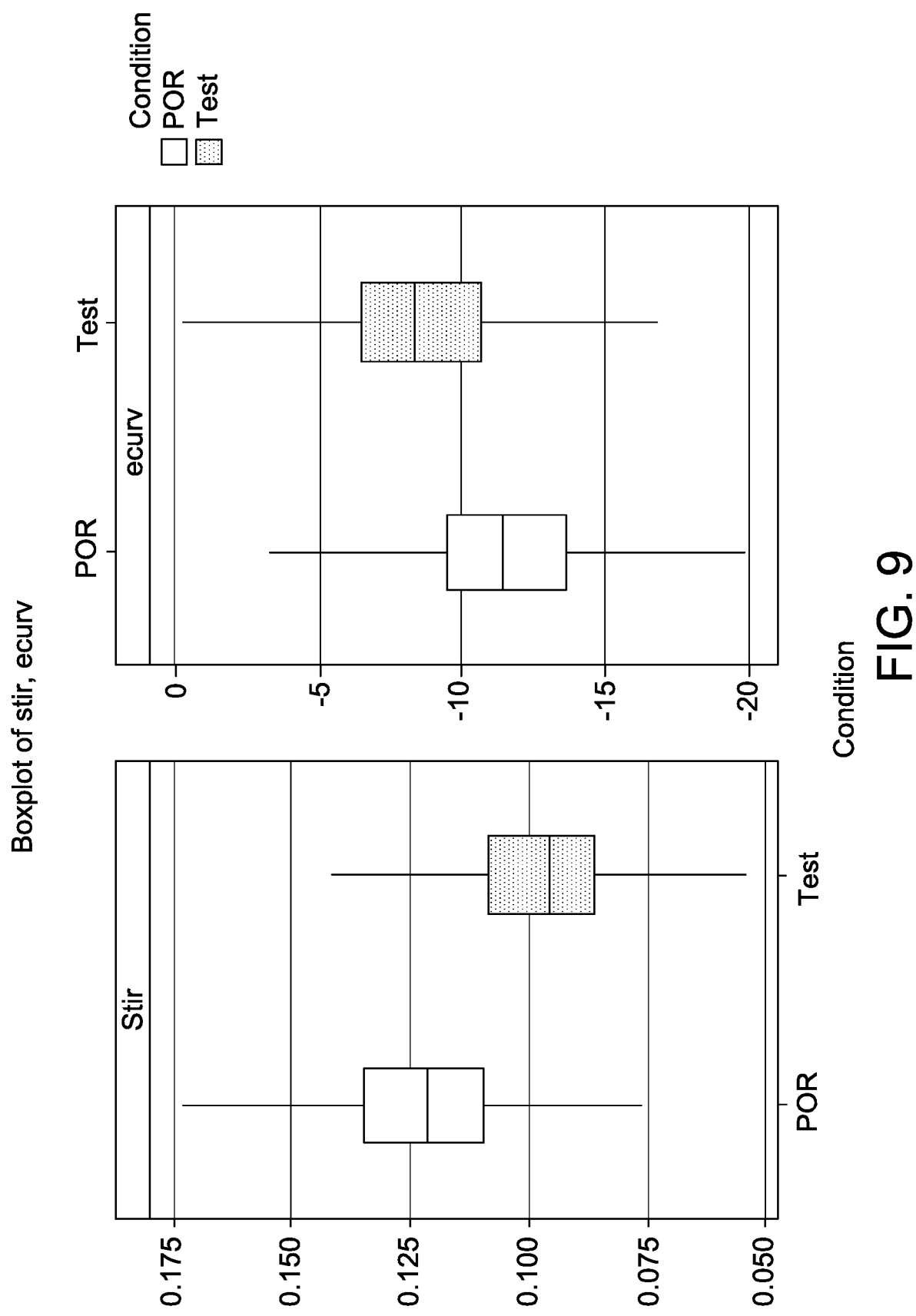
FIG. 9 shows box plots of the STIR and ECURV for substrates processed according to Example 1.
Figure 10:
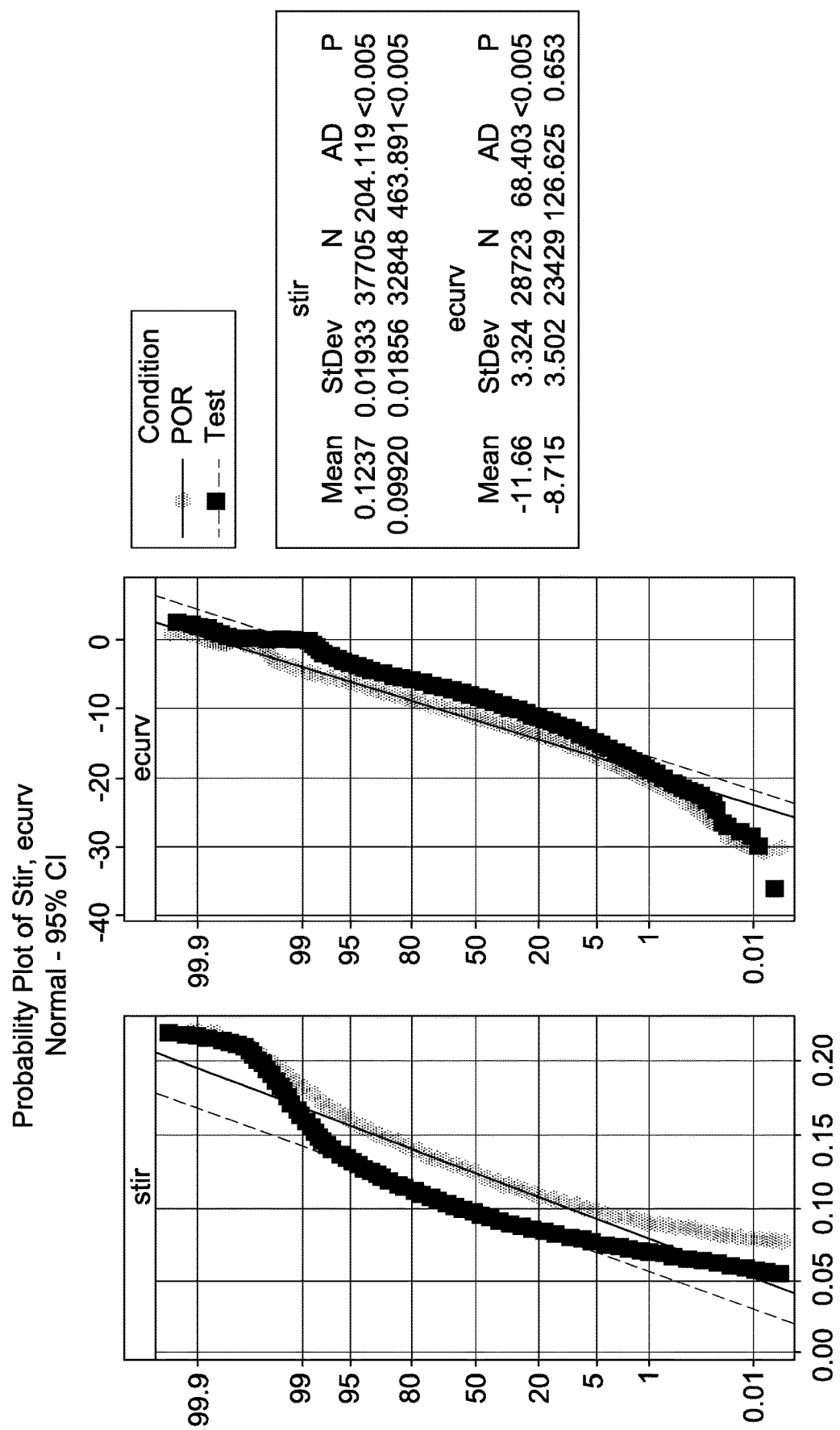
FIG. 10 shows probability plots of the STIR and ECURV for substrates processed according to Example 1.

As shown in FIG. 8, the method in which Slurry 1 and Slurry 2 are alternated results in improved flatness and improved edge roll-off. FIG. 9 shows a box plot of STIR and ecurv (deviation of edge roll-off) for the new method ("Test") vs the method in which the slurries were not alternated ("POR"). As shown in FIG. 9, the method in which the slurries were alternated exhibited improved STIR. FIG. 10 shows a probability plot of STIR and ecurv (deviation of edge roll-off). As shown in FIG. 10, the method in which the slurries were alternated exhibited improved STIR and ecurv.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for polishing a semiconductor substrate having a front surface and a back surface generally parallel to the front surface, the method comprising:
   contacting the front surface of the substrate with a polishing pad in the presence of a first polishing slurry in a first polishing step;
   contacting the front surface of the substrate with a polishing pad in the presence of a second polishing slurry in a second polishing step, the second polishing step commencing after the first polishing step; and
   contacting the front surface of the substrate with a polishing pad in the presence of the first polishing slurry in a third polishing step, the third polishing step commencing after the second polishing step.

2. The method as set forth in claim 1 comprising contacting the front surface of the substrate with a polishing pad in the presence of the second polishing slurry in a fourth polishing step, the fourth polishing step commencing after the third polishing step.

3. The method as set forth in claim 2 comprising contacting the front surface of the substrate with a polishing pad in the presence of the first polishing slurry in a fifth polishing step, the fifth polishing step commencing after the fourth polishing step.

4. The method as set forth in claim 3 comprising contacting the front surface of the substrate with a polishing pad in the presence of the second polishing slurry in a sixth polishing step, the sixth polishing step commencing after the fifth polishing step.

5. The method as set forth in claim 1 wherein the polishing pad that contacts the front surface of the substrate in each polishing step is the same polishing pad.

6. The method as set forth in claim 1 wherein the first polishing slurry comprises silica particles having a silica content of $X_1$ wt % and the second polishing slurry comprises silica particles having a silica content of $X_2$ wt %, wherein $X_1$ is greater than $X_2$.

7. The method as set forth in claim 6 wherein the ratio of $X_1$ to $X_2$ is at least about 2:1.

8. The method as set forth in claim 6 wherein the ratio of $X_1$ to $X_2$ is at least about 10:1.

9. The method as set forth in claim 6 wherein the ratio of $X_1$ to $X_2$ is at least about 15:1.

10. The method as set forth in claim 6 wherein the difference between $X_1$ and $X_2$ is at least about 5 wt %.

11. The method as set forth in claim 6 wherein the difference between $X_1$ and $X_2$ is at least about 25 wt %.

12. The method as set forth in claim 6 wherein the difference between $X_1$ and $X_2$ is at least about 50 wt %.

13. The method as set forth in claim 6 wherein the silica particles of the first slurry and the silica particles of the second slurry are each polymer-encapsulated.

14. The method as set forth in claim 1 wherein the back surface is not polished while polishing the front surface and wherein at least about 1 µm of material is removed from the front surface of the substrate.

15. The method as set forth in claim 1 wherein the substrate has a diameter of about 200 mm.

16. The method as set forth in claim 1 wherein each polishing slurry is a colloid.

17. The method as set forth in claim 1 wherein the first polishing step, second polishing step, and third polishing step are each performed on the same polishing apparatus.

18. The method as set forth in claim 17 wherein the polishing apparatus is a second polishing apparatus and, prior to the first polishing step, the substrate is positioned on a first polishing apparatus and the front surface of the substrate is contacted with a first polishing apparatus polishing pad in the presence of one or more second polishing apparatus slurries and the substrate is transferred from the first polishing apparatus to the second polishing apparatus.

19. The method as set forth in claim 18 further comprising transferring the substrate from the second polishing apparatus to a third polishing apparatus, the method comprising contacting the front surface of the substrate with a third polishing apparatus polishing pad in the presence of one or more third polishing apparatus slurries.

* * * * *